(12) United States Patent
Tomomatsu et al.

(10) Patent No.: US 9,375,915 B2
(45) Date of Patent: Jun. 28, 2016

(54) SCREEN PRINTING MACHINE AND SCREEN PRINTING METHOD

(71) Applicant: Panasonic Corporation, Osaka (JP)

(72) Inventors: Michinori Tomomatsu, Yamanashi (JP); Toshiyuki Murakami, Yamanashi (JP); Hiroki Kobayashi, Yamanashi (JP); Minoru Murakami, Yamanashi (JP); Akira Maeda, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/111,848

(22) PCT Filed: Mar. 6, 2013

(86) PCT No.: PCT/JP2013/001411
§ 371 (c)(1),
(2) Date: Oct. 15, 2013

(87) PCT Pub. No.: WO2013/168328
PCT Pub. Date: Nov. 14, 2013

(65) Prior Publication Data
US 2014/0318394 A1 Oct. 30, 2014

(30) Foreign Application Priority Data
May 7, 2012 (JP) .................................. 2012-105727

(51) Int. Cl.
*B41F 15/40* (2006.01)
*B41F 15/44* (2006.01)
(Continued)

(52) U.S. Cl.
CPC .............. *B41F 15/44* (2013.01); *B41F 15/0881* (2013.01); *B41F 15/26* (2013.01);
(Continued)

(58) Field of Classification Search
CPC .......... B41F 15/08; B41F 15/12; B41F 15/40; B41F 15/42; B41F 15/44
USPC .......................................... 101/114, 123, 129
IPC ....................................................... B41F 15/40
See application file for complete search history.

(56) References Cited

U.S. PATENT DOCUMENTS

| | | | | |
|---|---|---|---|---|
| 5,709,905 A | * | 1/1998 | Shaw et al. | ........................ 427/8 |
| 2011/0297020 A1 | | 12/2011 | Tanaka | |
| 2011/0303108 A1 | | 12/2011 | Tanaka | |

FOREIGN PATENT DOCUMENTS

| | | |
|---|---|---|
| CN | 102355996 A | 2/2012 |
| CN | 102355997 A | 2/2012 |

(Continued)

OTHER PUBLICATIONS

Partial English language translation of JP 2006-051757A, publication date Feb. 23, 2006.*

(Continued)

*Primary Examiner* — Leslie J Evanisko
(74) *Attorney, Agent, or Firm* — Pearne & Gordon LLP

(57) ABSTRACT

In a screen printing that shifts squeegees in a horizontal direction while abutting the squeegees against a mask, and slides the squeegees on the mask, and scrapes up the paste on the mask so that opening portions are filled with the paste to transfer the paste onto the substrate, a larger amount of paste Ps is supplied to regions in which the paste is scraped up by the end portions of the squeegee than a region in which the paste is scraped up by a center portion of the squeegee on the mask.

4 Claims, 12 Drawing Sheets

(51) Int. Cl.
*B41F 15/08* (2006.01)
*B41F 15/42* (2006.01)
*B41F 15/46* (2006.01)
*H05K 3/12* (2006.01)
*B41F 15/26* (2006.01)
*B41F 15/36* (2006.01)
*H05K 3/34* (2006.01)
*B41M 1/12* (2006.01)

(52) U.S. Cl.
CPC .............. *B41F 15/36* (2013.01); *B41F 15/423* (2013.01); *B41F 15/46* (2013.01); *H05K 3/1233* (2013.01); *B41M 1/12* (2013.01); *B41P 2215/132* (2013.01); *H05K 3/3484* (2013.01)

(56) References Cited

FOREIGN PATENT DOCUMENTS

| | | |
|---|---|---|
| JP | 07-205403 A | 8/1995 |
| JP | 2001-315302 A | 11/2001 |
| JP | 2006-051757 A | 2/2006 |
| JP | 2011-126207 A | 6/2011 |
| JP | 2012-081681 A | 4/2012 |
| JP | 2013-103418 A | 5/2013 |

OTHER PUBLICATIONS

International Search Report for PCT/JP2013/001411 dated Apr. 16, 2013.

Office Action for Chinese Application No. 201380001070.2 dated Jun. 30, 2015.

\* cited by examiner

SCREEN PRINTING MACHINE AND SCREEN PRINTING METHOD

TECHNICAL FIELD

The present invention relates to a screen printing machine and a screen printing method for sliding a squeegee on a mask brought into contact with a substrate, and scraping up a paste on the mask to transfer the paste to the substrate.

BACKGROUND ART

A screen printing machine is configured to move the squeegee in a horizontal direction while abutting the squeegee against the mask brought into contact with the substrate, and slide the squeegee on the mask to scrape up the paste on the mask, thereby filling an opening portion provided in the mask with the paste to transfer the paste onto the substrate. The squeegee that has finished the sliding operation on the mask then moves up, and separates from the mask, and is again abutted against the mask in printing operation for a subsequent substrate. The paste is supplied onto the mask from a paste supply portion such as a syringe (or by manual of an operator) when the printing operation first starts. When the printing operation progresses to decrease the paste down to a given amount, a supplementary paste is supplied onto the mask (for example, Patent Literature 1). The supply of the supplementary paste is normally conducted intensively in a center portion of the squeegee, or conducted at an equal distribution along a longitudinal direction of the squeegee.

CITATION LIST

Patent Literature

Patent Literature 1: JP-A H07-205403

SUMMARY OF INVENTION

Technical Problem

However, when the squeegee that has finished the sliding operation on the mask moves up, and separates from the mask, a part of the paste is attached to the squeegee, and pulled up. The overall paste on the mask is attracted to a center side of the squeegee. For that reason, in a distribution of the paste on the mask at the time of allowing the squeegee to move up, a region in which the paste is scraped up by the center portion of the squeegee is larger than regions in which the paste is scraped up by end portions of the squeegee. When the supplement of the paste is conducted intensively in the center portion of the squeegee, or conducted at the equal distribution along the longitudinal direction, the amount of paste becomes extremely large in the center portion of the squeegee, and a rolling diameter of the paste in the subsequent squeezing operation does not become even along the longitudinal direction of the squeegee. This causes a problem to prevent an improvement in the printing precision.

Under the circumstance, the present invention aims at providing a screen printing machine and a screen printing method which can equalize the rolling diameter of the paste rolled on the mask along the longitudinal direction of the squeegee to improve the printing precision.

Solution to Problem

A screen printing machine according to the invention comprises:
a mask that is brought into contact with a substrate;
a squeegee shift control portion that shifts squeegees in a horizontal direction while abutting the squeegees against the mask brought into contact with the substrate, and slides the squeegees on the mask, and scrapes up the paste on the mask so that opening portions provided in the mask are filled with the paste to transfer the paste onto the substrate; and
a paste supply portion that supplies a larger amount of paste to regions in which the paste is scraped up by end portions of the squeegee than a region in which the paste is scraped up by a center portion of the squeegee on the mask, before the paste is transferred onto the substrate by the squeegees.

A screen printing method according to the invention comprises:
a mask contact step of bringing a mask into contact with a substrate;
a paste transfer step of shifting squeegees in a horizontal direction while abutting the squeegees against the mask brought into contact with the substrate, and sliding the squeegees on the mask, and scraping up the paste on the mask so that opening portions provided in the mask are filled with the paste to transfer the paste onto the substrate; and
a paste supply step of supplies a larger amount of the paste to regions in which the paste is scraped up by the end portions of the squeegee than a region in which the paste is scraped up by a center portion of the squeegee on the mask, before the paste transfer step is executed.

Advantageous Effects of Invention

In the present invention, a larger amount of paste is supplied to regions in which the paste is scraped up by the end portions of the squeegee than a region in which the paste is scraped up by the center portion of the squeegee on the mask so that the distribution of the paste at the time of supplying the paste becomes even along the longitudinal direction of the squeegee. For that reason, the rolling diameter of the paste rolled on the mask can be equalized along the longitudinal direction of the squeegee, as a result of which the printing precision can be improved.

DESCRIPTION OF EMBODIMENTS

Figure 1:
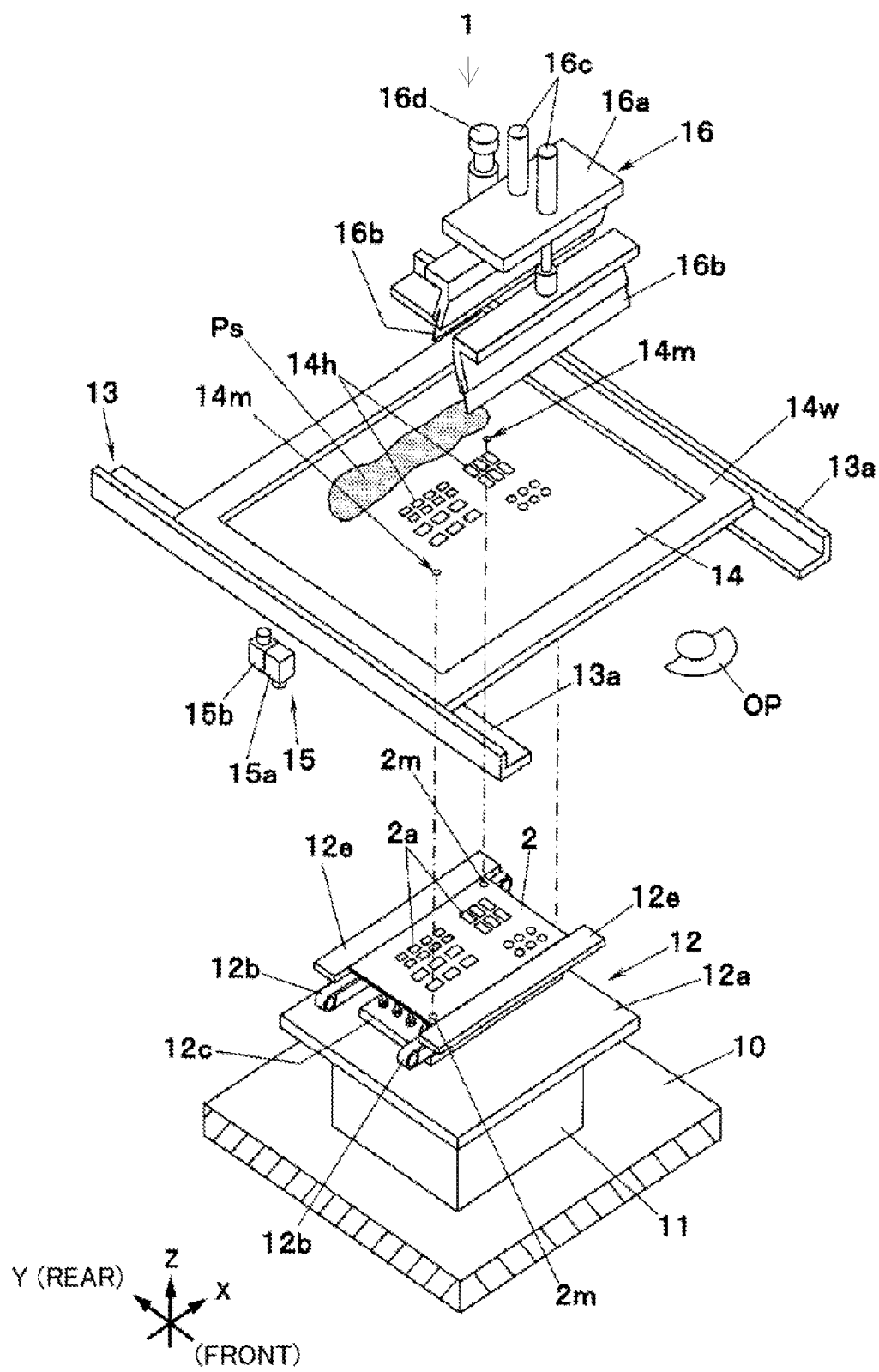
FIG. 1 is a perspective view of a main portion of a screen printing machine according to an embodiment of the present invention.
Figure 2:
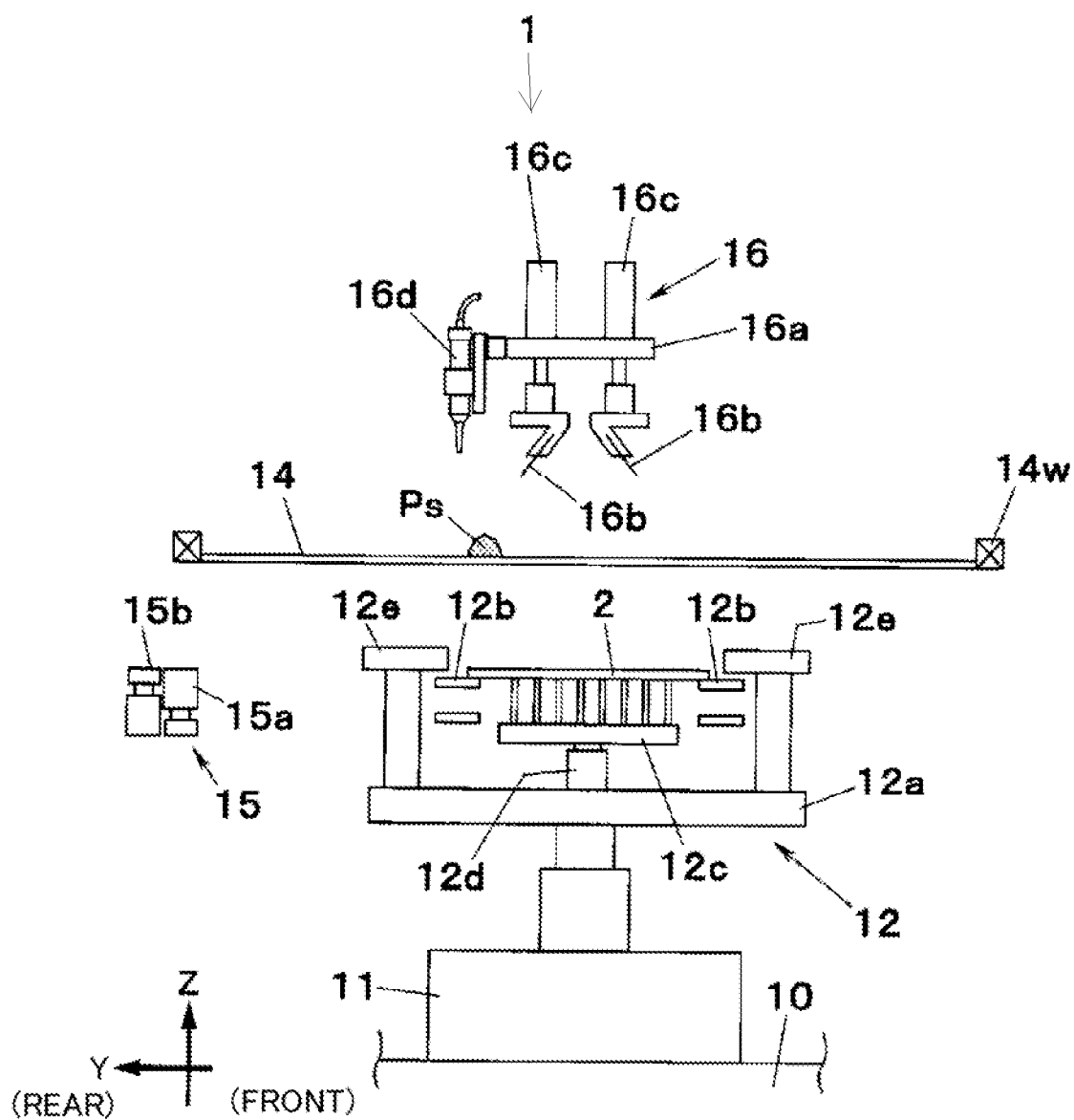
FIG. 2 is a side view of the main portion of the screen printing machine according to the embodiment of the present invention.

Hereinafter, an embodiment of the present invention will be described with reference to the drawings. A screen printing machine 1 illustrated in FIGS. 1 and 2 represents a device that is incorporated into a component mounting system for mounting a component on a substrate 2, and conducts the operation (screen printing operation) of screen-printing a paste Ps such as solder on electrode portions 2a of the substrate 2. The screen printing machine 1 includes a substrate holding unit shift mechanism 11 that is disposed on a base 10, a substrate holding unit 12 that is shifted by the substrate holding unit shift mechanism 11, a mask holder 13 that is installed above the substrate holding unit 12, a mask 14 that is held in a horizontal posture by the mask holder 13, a camera unit 15 that is movably disposed below the mask 14, and a squeegee unit 16 that is movably disposed above the mask 14. In the following description, a transport direction of the substrate 2 is set to an X-axial direction (lateral direction viewed from an operator OP), and a horizontal in-plane direction orthogonal to the X-axis is set to a Y-axial direction (longitudinal direction viewed from the operator OP). Also, a vertical direction is set to a Z-axis.

Referring to FIG. 1, the mask holder 13 includes a pair of right and left mask placement members 13a each having an L-shaped cross-section, which extend in the Y-axial direction, and face each other in the X-axial direction. The mask 14 is configured by a rectangular plate member made of a thin metal, and has a large number of opening portions 14h corresponding to the electrode portions 2a of the substrate 2. A rectangular mask frame 14w disposed on an outer edge of the mask 14 is supported by the mask holder 13.

Referring to FIG. 1, two substrate side marks 2m are disposed at one diagonal position on the substrate 2, and two mask side marks 14m are disposed on the mask 14 in correspondence with those two substrate side marks 2m. When the substrate 2 moves up in a state where the two substrate side marks 2m and the two mask side marks 14m vertically face each other, and the substrate 2 is brought into contact with the mask 14, the electrode portions 2a of the substrate 2 matches the opening portions 14h disposed in the mask 14.

Referring to FIGS. 1 and 2, the substrate holding unit 12 includes a base portion 12a that is disposed to be movable up and down with respect to the base 10, substrate transport conveyors 12b that are attached to the base portion 12a, and transports the substrate 2 in the X-axial direction, a lower holding member 12c that is located below the substrate 2 transported by the substrate transport conveyors 12b, and positioned at a given substrate holding position, a substrate lifting cylinder 12d that moves up and down the lower holding member 12c, and pushes up the substrate 2, and a pair of clamp members 12e that clamps and holds the substrate 2 pushed up by the substrate lifting cylinder 12d from the Y-axial direction.

Figure 3:
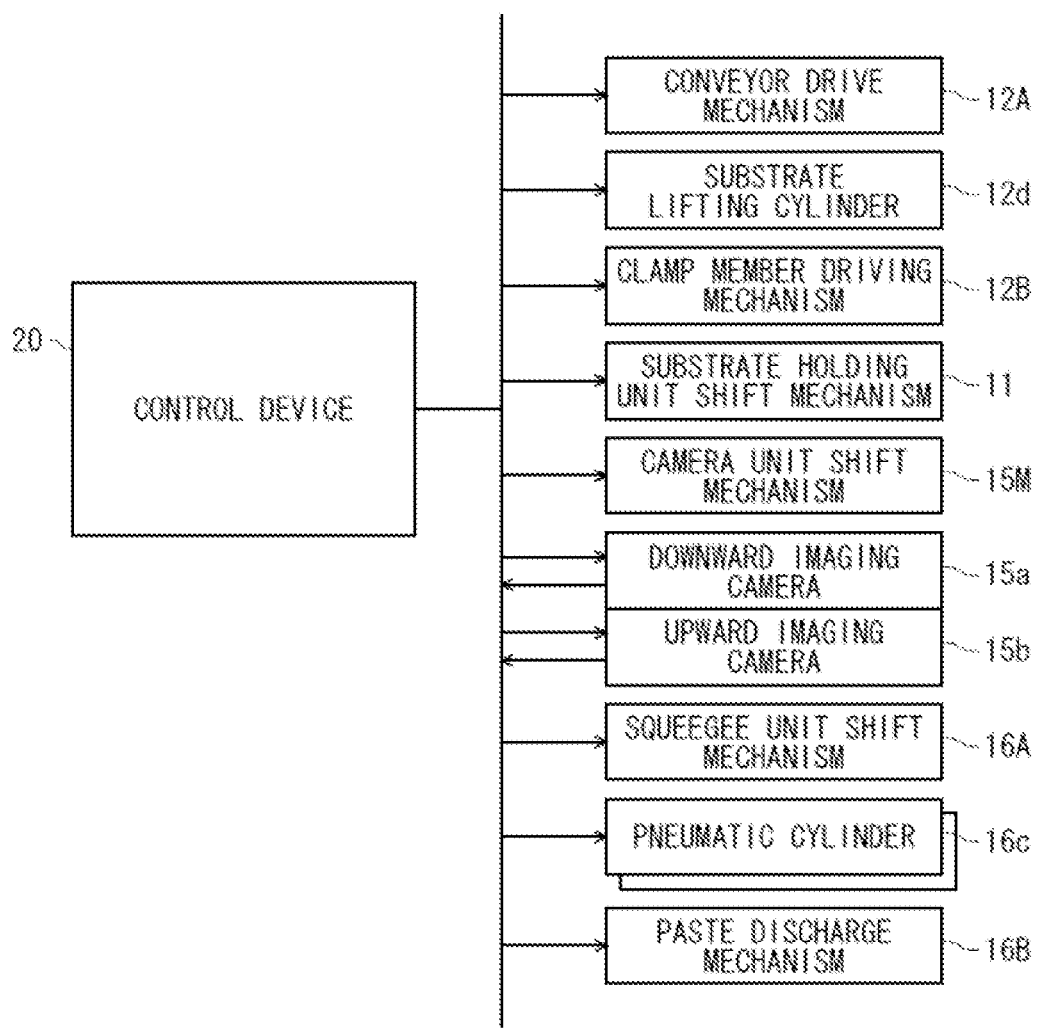
FIG. 3 is a block diagram illustrating a control system of the screen printing machine according to the embodiment of the present invention.

Referring to FIG. 3, the actuation control of a conveyor drive mechanism 12A including an actuator, etc., not shown for driving the substrate transport conveyors 12b, the actuation control of the substrate lifting cylinder 12d, and the control of the clamp operation for the substrate 2 by a clamp member driving mechanism 12B including an actuator, etc., not shown for driving the pair of clamp members 12e are conducted by a control device 20 equipped in the screen printing machine 1.

The substrate holding unit shift mechanism 11 includes an XYZ robot, and is controlled in the actuation by the control device 20 to shift (including rotation) the substrate holding unit 12 within a horizontal plane, and shift the substrate holding unit 12 in a vertical direction (Z-axial direction).

Referring to FIGS. 1 and 2, the camera unit 15 includes a downward imaging camera 15a that directs an imaging visual field downward, and an upward imaging camera 15b that directs the imaging visual field upward. The camera unit 15 shifts within a horizontal plane below the mask 14 held by the mask holder 13 due to the operation of a camera unit shift mechanism 15M (FIG. 3) including a Cartesian coordinate robot not shown, which is controlled in the actuation by the control device 20.

The imaging operation of the downward imaging camera 15a and the imaging operation of the upward imaging camera 15b are controlled by the control device 20. Image data obtained by the imaging operation of the downward imaging camera 15a, and image data obtained by the imaging operation of the upward imaging camera 15b are transmitted to the control device 20 (FIG. 3).

Referring to FIGS. 1 and 2, the squeegee unit 16 includes a base portion 16a that is movable in the Y-axial direction above the mask 14 by the actuation of a squeegee unit shift mechanism 16A (FIG. 3) including a Cartesian coordinate robot not shown, and two squeegees 16b facing each other in the Y-axial direction below the base portion 16a. The respective squeegees 16b are designed to move up and down below the base portion 16a by two pneumatic cylinders 16c attached to the base portion 16a, independently. The actuation control of the squeegee unit shift mechanism 16A, and the lifting control of the squeegees 16b by the actuation of the respective pneumatic cylinders 16c are conducted by the control device 20 (FIG. 3).

Referring to FIGS. 1 and 2, a rear end of the base portion 16a of the squeegee unit 16 is equipped with a paste supply syringe 16d that discharges the paste Ps from a discharge port directed downward. The supply control of the paste Ps by the paste supply syringe 16d is conducted by allowing the control device 20 to conduct the actuation control of a paste discharge mechanism 16B including an actuator, etc., not shown (FIG. 3).

The control device 20 alternately executes "squeezing by the rear squeegee 16b" in which the rear squeegee 16b located above the rear clamp member 12e is moved down and abutted against the mask 14, and thereafter the base portion 16a is shifted from the rear toward the front to shift the rear squeegee 16b to above the front clamp member 12e while sliding the rear squeegee 16b on the mask 14, and "squeezing by the front squeegee 16b" in which the front squeegee 16b located above the front clamp member 12e is moved down and abutted against the mask 14, and thereafter the base portion 16a is shifted from the front toward the rear to shift the front squeegee 16b to above the rear clamp member 12e while sliding the front squeegee 16b on the mask 14.

Figure 4:
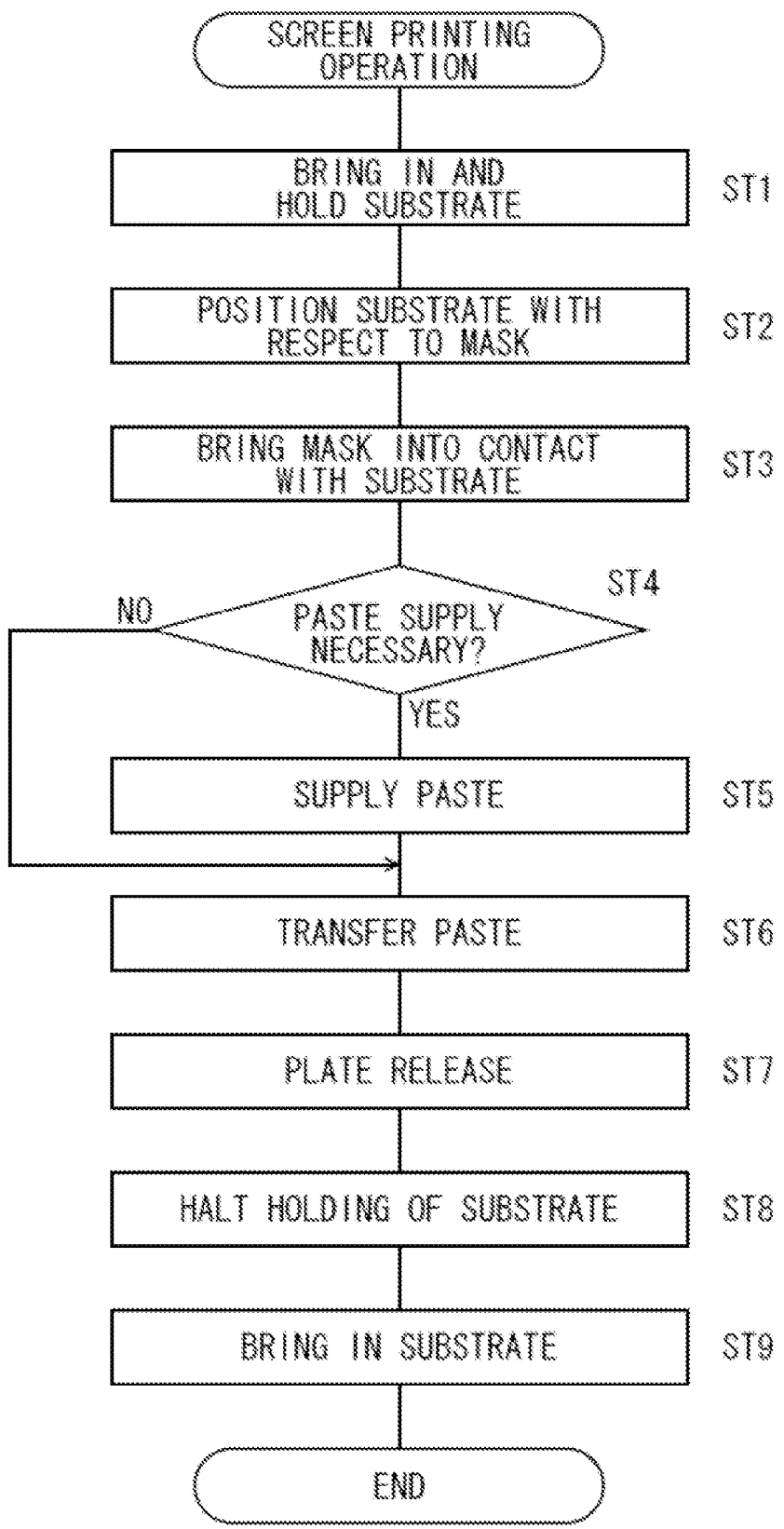
FIG. 4 is a flowchart illustrating steps of executing screen operation which is conducted by the screen printing machine according to the embodiment of the present invention.
Figure 5A:
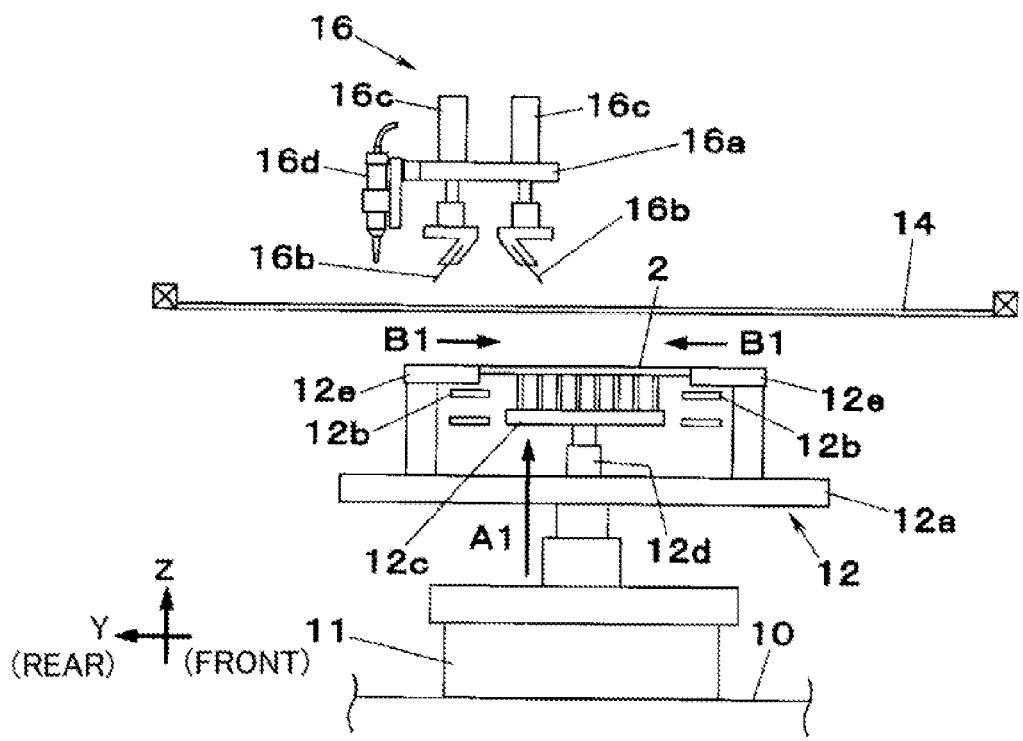
FIGS. 5A and 5B are diagrams illustrating states in which the screen printing machine conducts the screen printing operation according to the embodiment of the present invention.

Subsequently, a description will be given of steps of executing the screen printing operation (screen printing method) that is conducted by the screen printing machine 1 with reference to a flowchart of FIG. 4, and illustrative diagrams of FIGS. 5A to 8B. In the screen printing operation, the control device 20 first brings in the substrate 2 loaded from an external of the screen printing machine 1 by the substrate transport conveyors 12b to locate the substrate 2 at the above-mentioned given operation position. Then, the push-up (arrow A1 indicated in FIG. 5A) of the substrate 2 by the substrate lifting cylinder 12d, and clamp (arrow B1 indicated in FIG. 5A) of the substrate 2 by the clamp member 12e are conducted to hold the substrate 2 (ST1 indicated in FIG. 4. FIG. 5A).

The control device 20 holds the substrate 2 as described above, and then conducts the actuation control of the camera unit shift mechanism 15M. Then, the control device 20 positions the downward imaging camera 15a above the substrate side marks 2m disposed on the substrate 2, and allows the downward imaging camera 15a to image the substrate side marks 2m, and grasps the position of the substrate 2 according to the image data thereof. Also, the control device 20 positions the upward imaging camera 15b to below the mask side marks 14m disposed on the mask 14, and allows the upward imaging camera 15b to image the mask side marks 14m, and grasps the position of the mask 14 according to the image data thereof. Then, the control device 20 shifts the substrate holding unit 12 in the horizontal in-plane direction so that the substrate side marks 2m and the mask side marks 14m face each other vertically, and positions the substrate 2 with respect to the mask 14 in the horizontal in-plane direction (Step ST2).

Figure 5B:
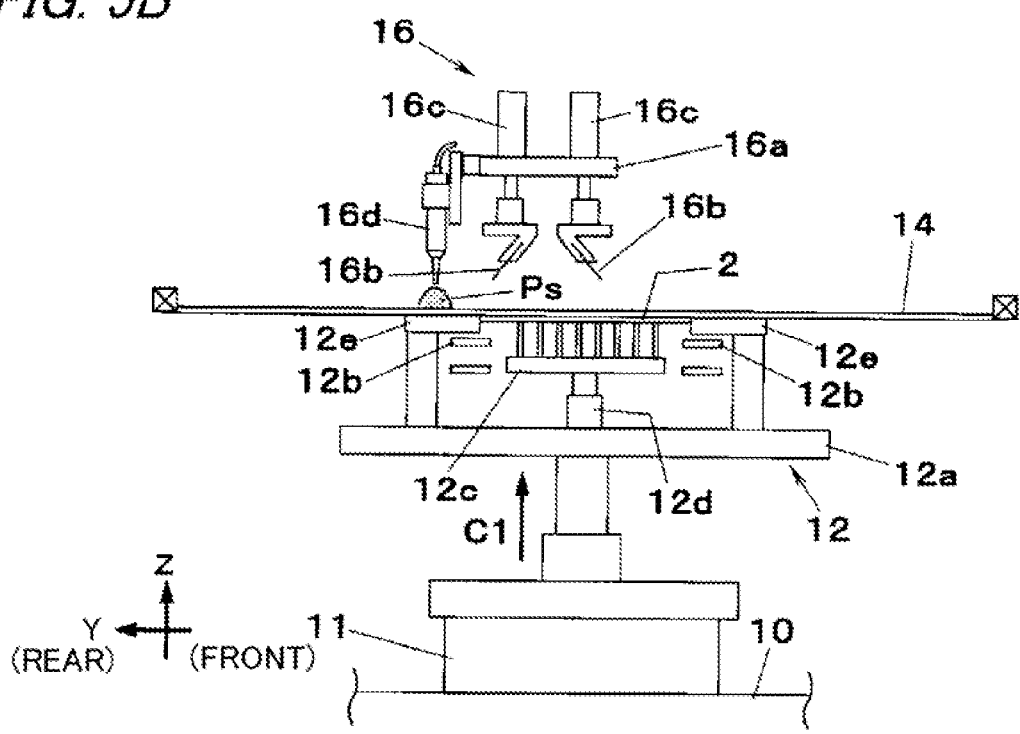
Figure 6A:
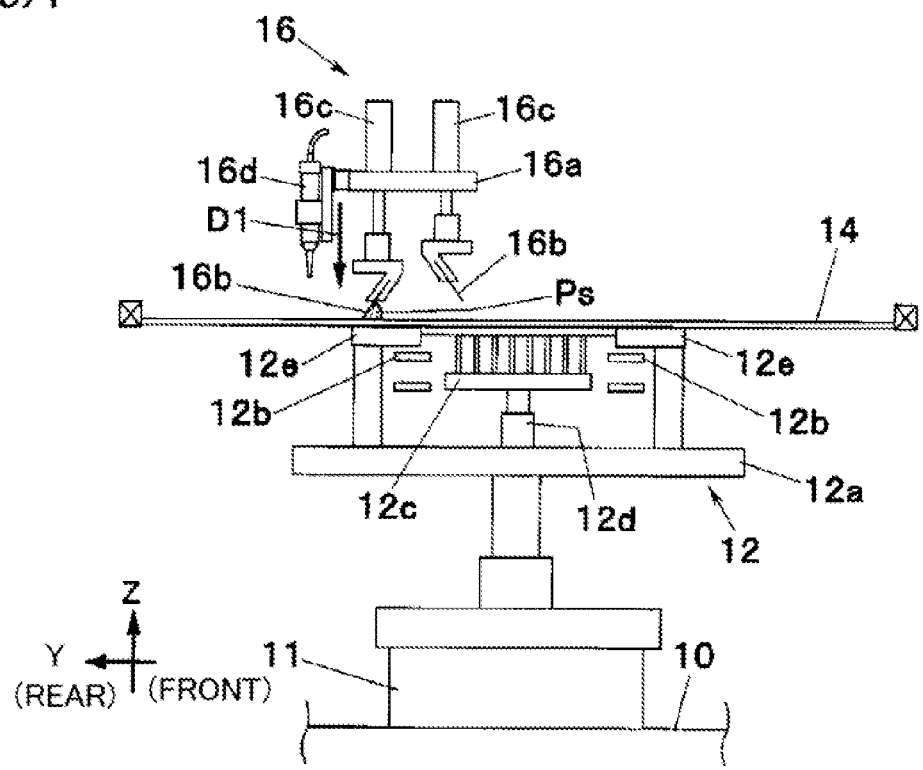
FIGS. 6A and 6B are diagrams illustrating states in which the screen printing machine conducts the screen printing operation according to the embodiment of the present invention.
Figure 6B:
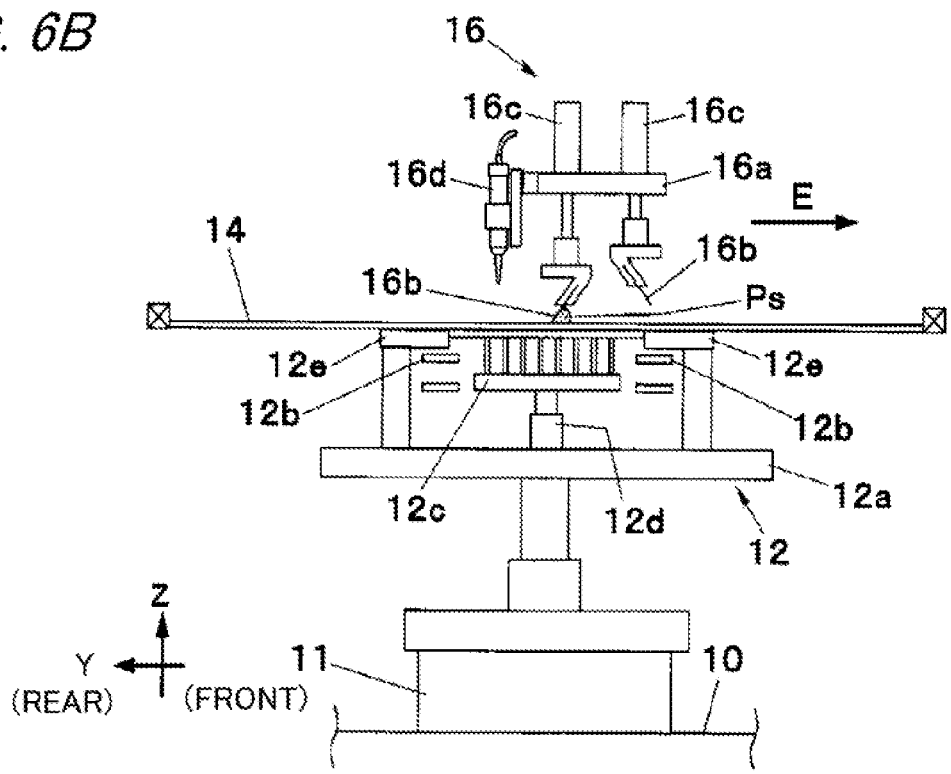

After completing the positioning of the substrate 2 with respect to the mask 14, the control device 20 conducts the actuation control of the substrate holding unit shift mechanism 11 to move up the substrate holding unit 12 with respect to the base 10 (arrow C1 indicated in FIG. 5B). Then, the control device 20 brings an upper surface of the substrate 2 held by the pair of clamp members 12e into contact with a lower surface of the mask 14, to thereby bring the substrate 2 into the mask 14 (Step ST3. FIG. 5B). As a result, the electrode portions 2a on the substrate 2 matches the opening portions 14h of the mask 14.

After bringing the substrate 2 into contact with the mask 14, the control device 20 determines whether there is a need to supply the paste Ps onto the mask 14, or not (Step ST4). As a result, when the control device 20 determines that there is a need to supply the paste Ps onto the mask 14, the control device 20 conducts the actuation control of the squeegee unit shift mechanism 16A to move the paste supply syringe 16d to a given position above the mask 14, conducts the actuation control of the paste discharge mechanism 16B, and discharges and supplies the paste Ps onto the mask 14 by the paste supply syringe 16d (Step ST5. FIG. 5B).

The control device 20 supplies the paste Ps onto the mask 14 in Step ST5, or determines that there is no need to supply the paste Ps onto the mask 14 in Step ST4. At this time, the control device 20 conducts squeezing by the squeegees 16b, and transfers the paste Ps supplied onto the mask 14 in advance to the electrode portions 2a of the substrate 2 (Step ST6).

The control device 20 executes one of the squeezing by the rear squeegee 16b and the squeezing by the front squeegee 16b once for each substrate 2 in Step ST6. When the control device 20 conducts the squeezing by the rear squeegee 16b, the control device 20 moves the overall squeegee unit 16 so that the rear squeegee 16b is positioned above the rear clamp member 12e. Thereafter, the control device 20 moves down the rear squeegee 16b (arrow D1 indicated in FIG. 6A), and moves the base portion 16a forward (arrow E indicated in FIG. 6B) while keeping a state in which the rear squeegee 16b is abutted against the upper surface of the mask 14 to perform the squeezing by the rear squeegee 16b.

Figure 7A:
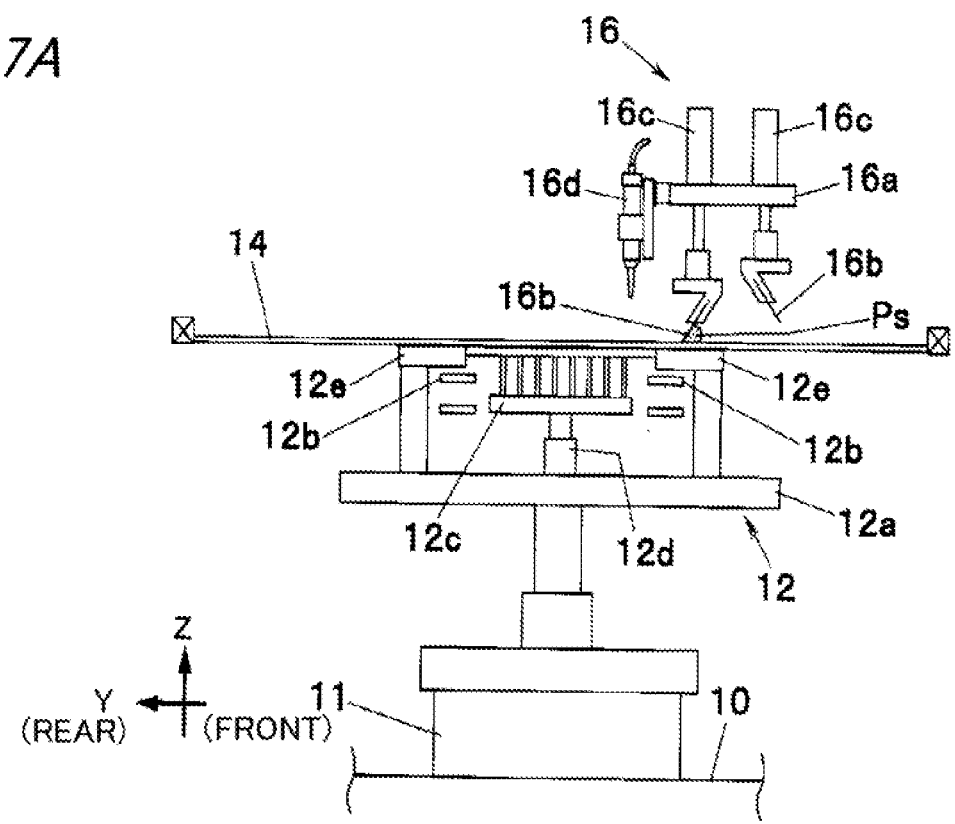
FIGS. 7A and 7B are diagrams illustrating the operation of the screen printing machine according to the embodiment of the present invention.
Figure 7B:
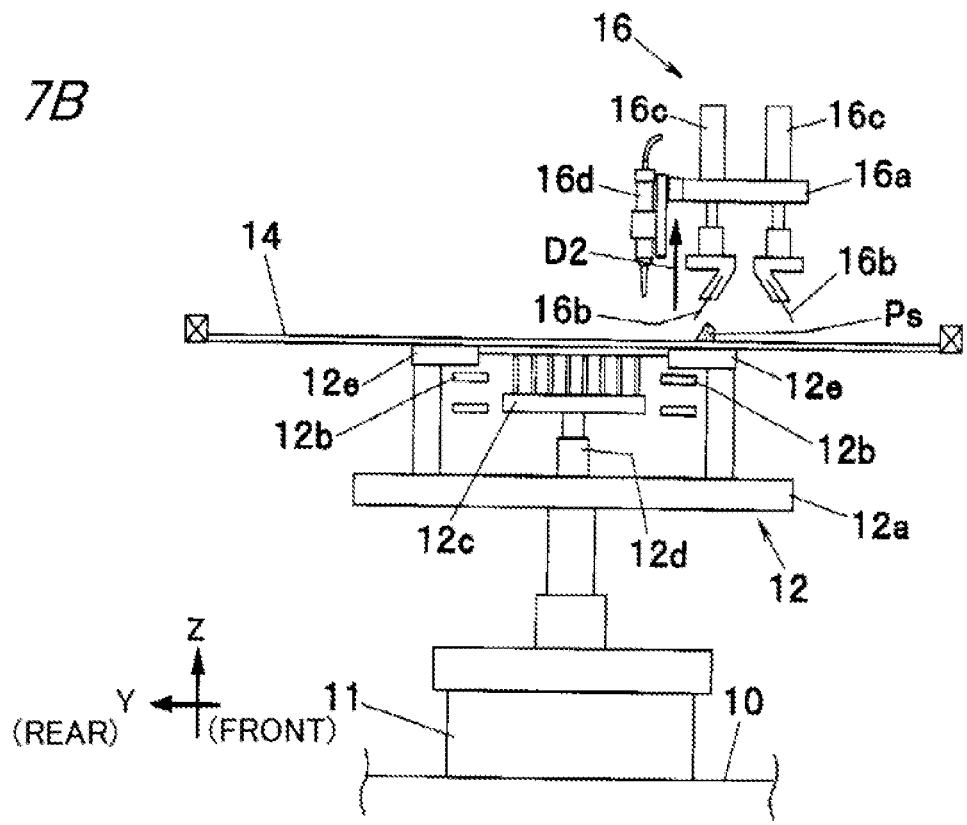

After the rear squeegee 16b has arrived at an upper region of the front clamp member 12e (FIG. 7A), the control device 20 moves up the rear squeegee 16b, and returns the squeegees 16b to an initial position (height) (FIG. 7B. Arrow D2 indicated in the figure). The paste Ps is scraped up from the rear side of the mask 14 toward the front side by the squeezing (sliding on the mask 14) by the rear squeegee 16b, and during this operation, the paste Ps is filled within the opening portions 14h of the mask 14, and transferred onto the electrode portions 2a of the substrate 2.

Figure 8A:
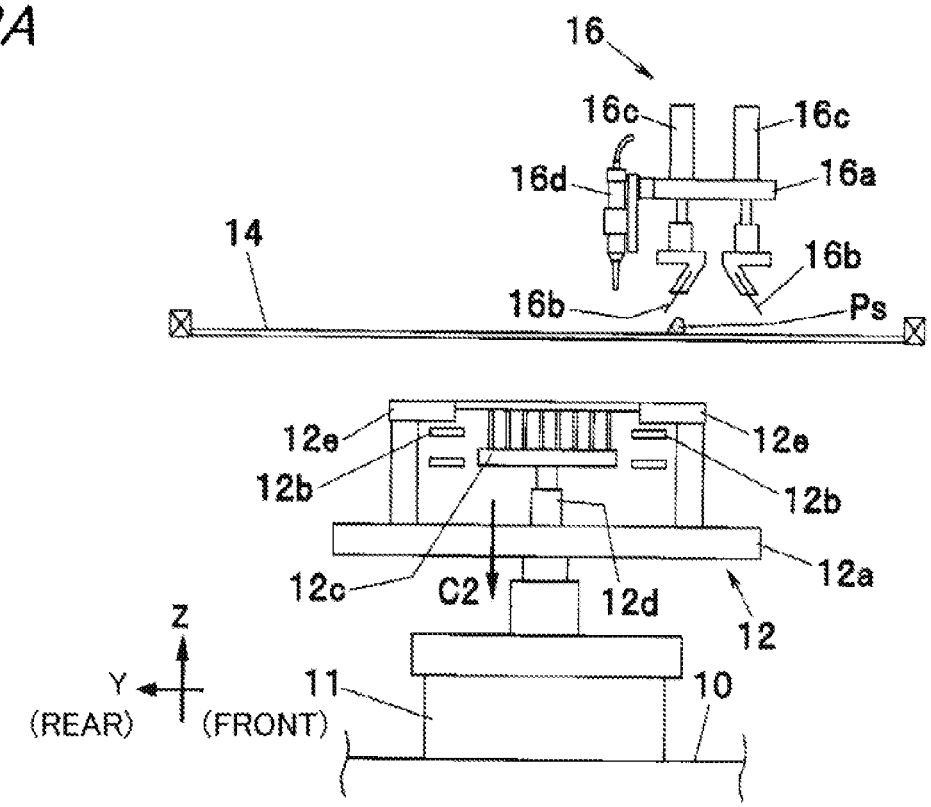
FIGS. 8A and 8B are diagrams illustrating the operation of the screen printing machine according to the embodiment of the present invention.

The control device 20 transfers the paste Ps onto the electrode portions 2a of the substrate 2, and thereafter actuates the substrate holding unit shift mechanism 11 so as to move down the substrate holding unit 12, to thereby separate the substrate 2 from the mask 14 (arrow C2 indicated in FIG. 8A), and conducts plate release (Step ST7. FIG. 8A). As a result, the paste Ps remains on the electrode portions 2a of the substrate 2, and the paste Ps is printed on the substrate 2.

Figure 8B:
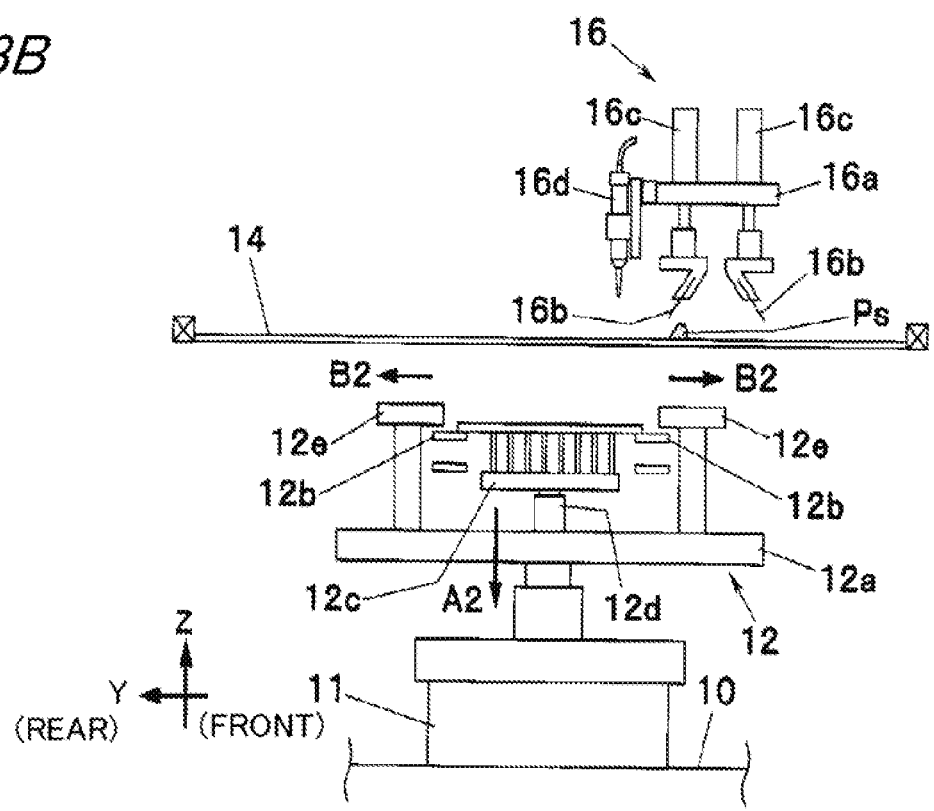

After the control device 20 has conducted the plate release, the control device 20 halts the holding of the substrate 2 by the substrate holding unit 12 (Step ST8). The holding of the substrate 2 is halted specifically in such a manner that the control device 20 conducts the actuation control of the clamp member driving mechanism 12B to open the damp members 12e (arrow B2 indicated in FIG. 8B), then actuates the substrate lifting cylinder 12d to move down the substrate 2 (arrow A2 indicated in FIG. 8B), and moves both ends of the substrate 2 onto the pair of substrate transport conveyors 12b (FIG. 8B).

After halting the holding of the substrate 2, the control device 20 actuates the substrate transport conveyor 12b to carry out the substrate 2 to the external of the screen printing machine 1 (Step ST9).

After the screen printing has been completed for one substrate 2 in this manner, the control device 20 executes the above steps ST1 to ST9 on another substrate 2 next loaded in the same steps. However, in turn, the paste transfer step in Step ST6 is conducted by the squeezing by the front squeegee 16b, and alternately executes the squeezing by the rear squeegee 16b and the squeezing by the front squeegee 16b every time a new substrate 2 is loaded.

Figure 9A:
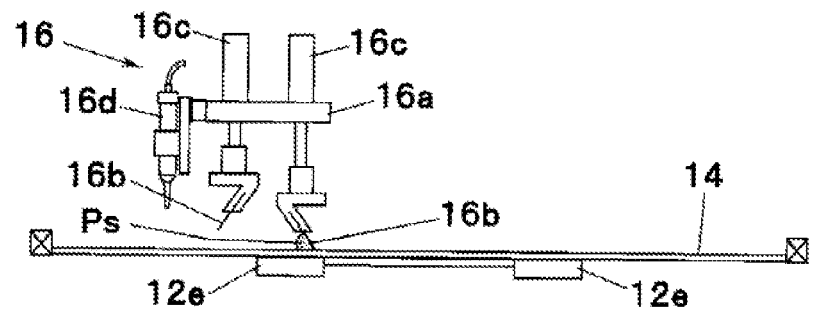
FIGS. 9A, 9B, 9C, and 9D are partial side views of a neighborhood of a mask at the time of supplying a paste by the screen printing machine according to the embodiment of the present invention.
Figure 9B:
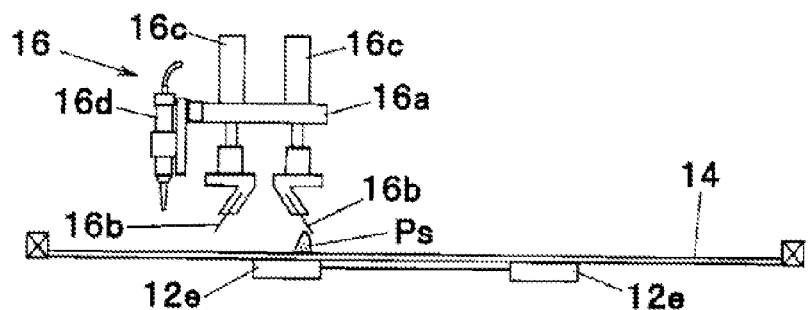
Figure 10A:
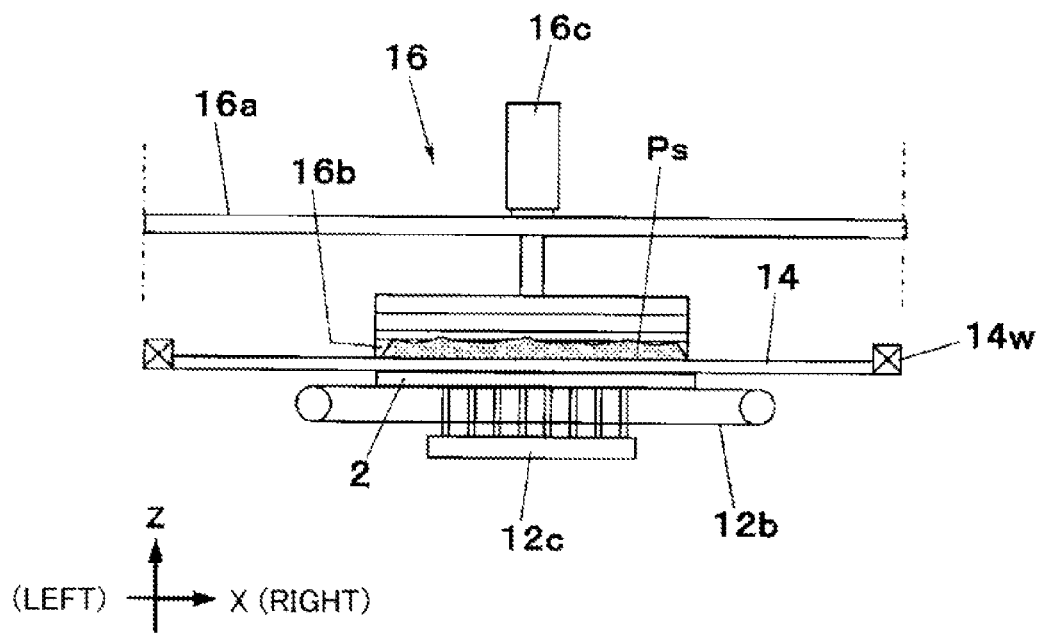
FIGS. 10A and 10B are partial front views of a neighborhood area of a mask at the time of supplying the paste by the screen printing machine according to the embodiment of the present invention.
Figure 10B:
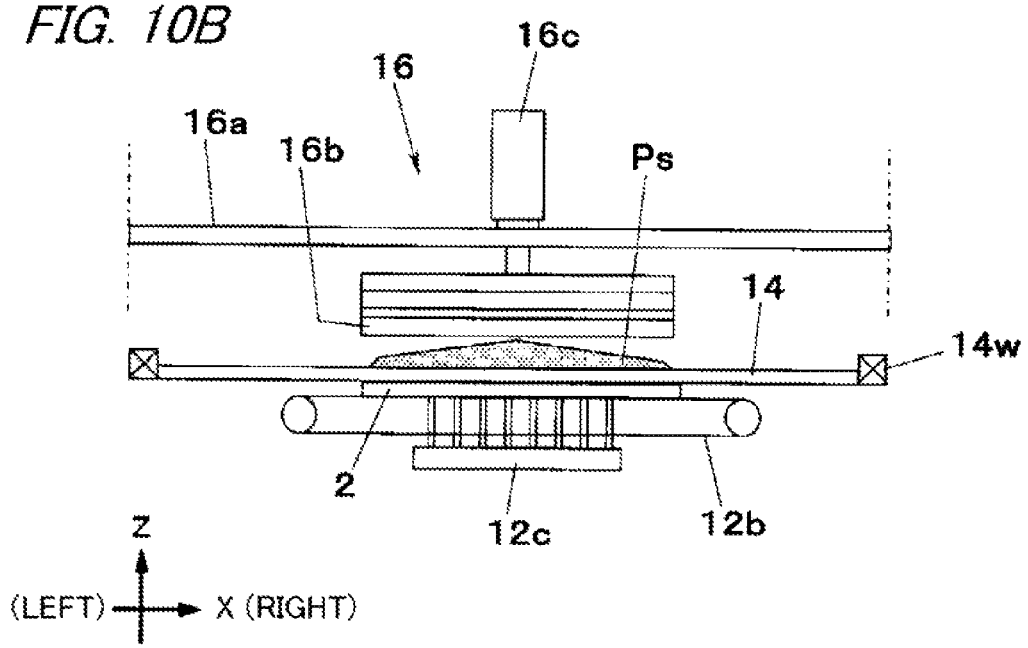
Figure 11A:
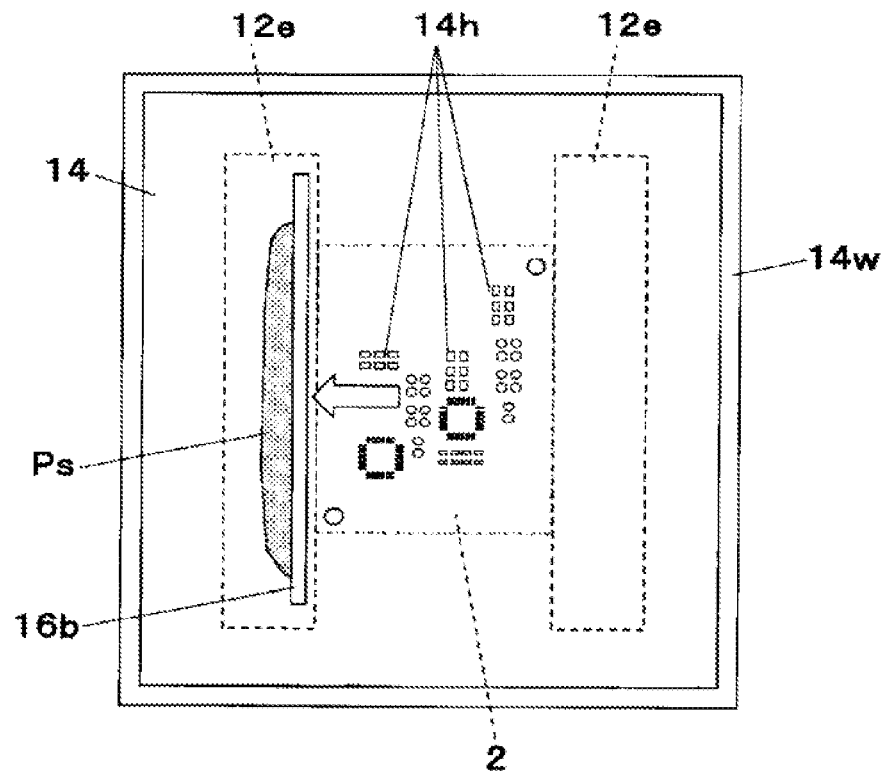
FIGS. 11A and 11B are plan views of the mask at the time of supplying the paste by the screen printing machine according to the embodiment of the present invention.
Figure 11B:
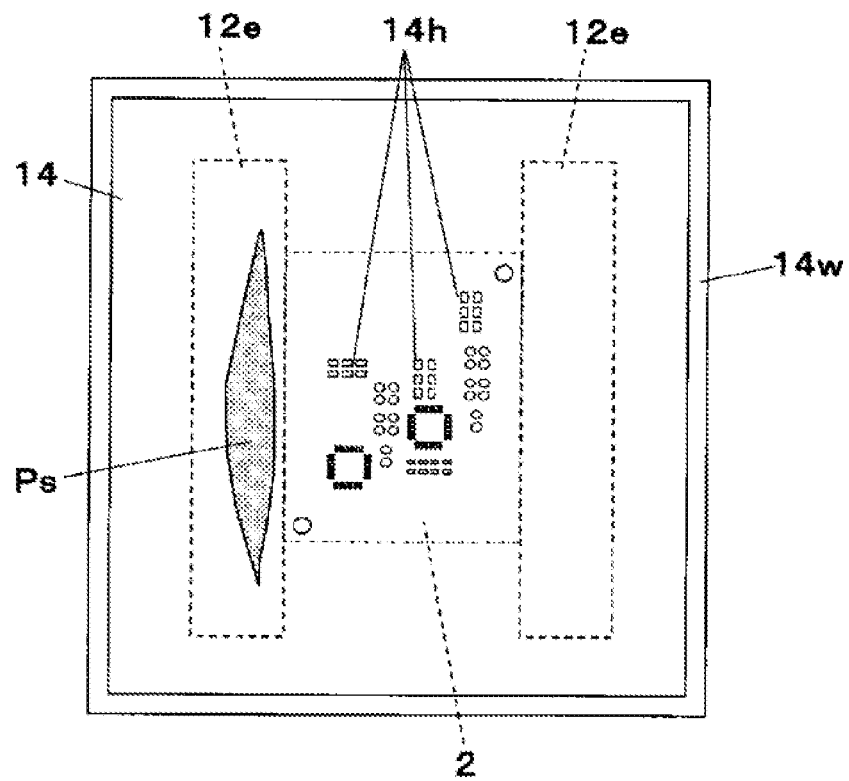

Incidentally, in the paste transfer process of the above Step ST6, at the time when one squeezing (squeezing by the front squeegee 16b in this example) has been completed (FIG. 9A), the paste Ps on the mask 14 has an even thickness along the longitudinal direction of the squeegees 16b FIG. 10A and FIG. 11A). When the squeegees 16b move up to separate from the mask 14 (FIG. 9B), a part of the paste Ps is attached onto the squeegees 16b, and pulled up, and the overall paste Ps on the mask 14 is attracted to a center side of the squeegee 16b (FIGS. 10B and 11B). For that reason, in a distribution of the paste Ps on the mask 14 at the time of allowing the squeegee 16b to move up, regions in which the paste is scraped up by the center portions of the squeegee is larger than a region in which the paste is scraped up by the end of the squeegee (FIG. 11B).

Figure 9C:
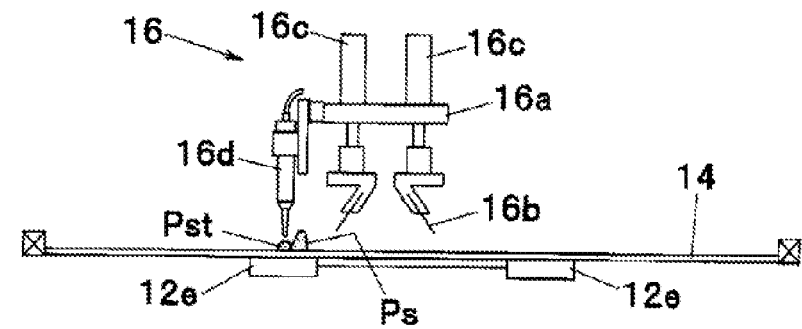
Figure 9D:
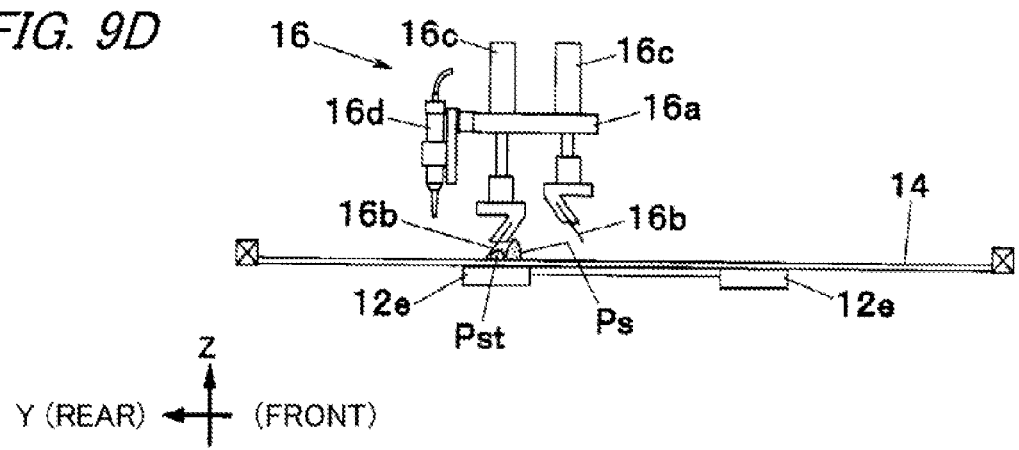

When the control device 20 conducts the supply of the paste Ps onto the mask 14 in the paste supply process of Step ST5, the control device 20 shifts the squeegee unit 16 so that the paste supply syringe 16d is positioned above the rear clamp member 12e, and then discharges the supplementary paste Ps (symbol Pst) from the paste supply syringe 16d (FIG. 9C). In this situation, a larger amount of paste Ps is supplied to the regions in which the paste Ps is scraped up by the end portions of the squeegee 16b than the region in which the paste Ps is scraped up by the center portion of the squeegee 16b on the mask 14. As a result, the distribution of the paste Ps at the time of supplying the paste Ps onto the mask 14 becomes even along the longitudinal direction of the squeegees 16b (FIG. 12A).

Figure 12A:
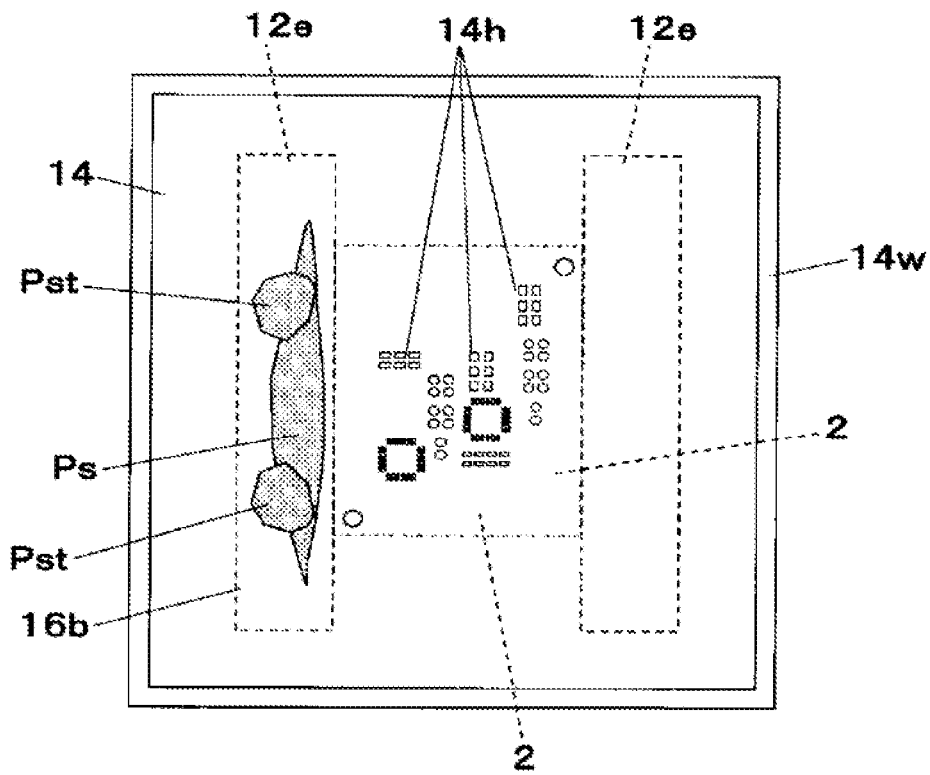
FIGS. 12A and 12B are plan views of the mask at the time of supplying the paste by the screen printing machine according to the embodiment of the present invention.

FIG. 12A illustrates an example in which the supplementary paste Pst is supplied only to the region in which the paste Ps is scraped up by both ends of the squeegees 16b. If the larger amount of paste Ps is supplied to the regions in which the paste Ps is scraped up by the end portions of the squeegee 16b than the region in which the paste Ps is scraped up by the center portion of the squeegee 16b on the mask 14, the supplementary paste Pst may be also supplied to the region in which the paste is scraped up by the center portion of the squeegees 16b.

Also, in FIG. 12A, the supplementary paste Pst is supplied to two regions in which the paste Ps is scraped up by both ends of the squeegees 16b. However, the paste Pst may be alternately, not at the same time, supplied to both ends of the squeegees 16b one by one every time the paste Ps is supplied (supplemented).

Figure 12B:
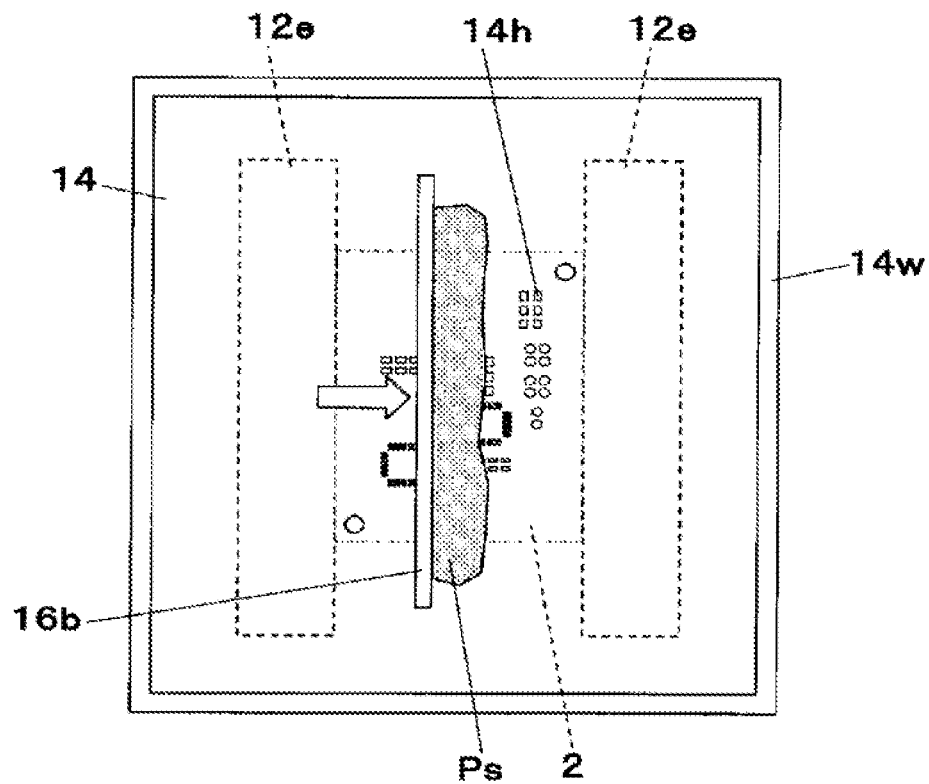

After the control device 20 conducts the supply (supplement) of the paste Ps as described above, the control device 20 abuts the rear squeegee 16b at a rear position of the paste Ps (both of the paste Ps originally remaining on the mask 14, and the supplementary paste Ps on the mask 14) (FIG. 9O). Then, the control device 20 shifts the squeegee unit 16 forward, and executes the squeezing by the rear squeegee 16b. In this situation, the rotating diameter of the paste Ps rolled on the mask 14 becomes even along the longitudinal direction of the squeegees 16b (FIG. 12B).

In this way, the screen printing machine 1 according to this embodiment includes a squeegee shift control unit (the control device 20 and the squeegee unit shift mechanism 16A) that shifts the squeegees 16b in the horizontal direction while abutting the squeegees 16b against the mask 14 brought into contact with the substrate 2 and the mask 14 brought into contact with the substrate 2, and then slides the squeegees 16b on the mask 14, and scrapes up the paste Ps on the mask 14 whereby the opening portions 14h provided in the mask 14 are filled with the paste Ps to transfer the paste Ps onto the substrate 2, and a paste supply portion (the paste supply syringe 16d, the control device 20, and the squeegee unit shift mechanism 16A) that supplies a larger amount of paste Ps to the regions in which the paste Ps is scraped up by the end portions of the squeegee 16b than the region in which the paste Ps is scraped up by the center portion of the squeegee 16b on the mask 14, before the paste Ps is transferred onto the substrate 2 by the squeegees 16b.

Also, the screen printing method using the screen printing machine 1 according to this embodiment includes a mask contact process (Step ST3) of bringing the mask 14 into contact with the substrate 2, a paste transfer process (Step ST6) of shifting the squeegees 16b in the horizontal direction while abutting the squeegees 16b against the mask 14 brought into contact with the substrate 2, and then sliding the squeegees 16b on the mask 14 to scrape up the paste Ps on the mask 14 whereby the opening portions 14h provided in the mask 14 are filled with the paste Ps to transfer the paste Ps onto the substrate 2, and a paste supply process (Step ST5) of supplying a larger amount of paste Ps to the regions in which the paste Ps is scraped up by the end portions of the squeegee 16b than the region in which the paste Ps is scraped up by the center portion of the squeegee 16b on the mask 14, before executing the paste transfer process.

In the screen printing machine 1 (screen printing method) according to this embodiment, the larger amount of paste Ps is supplied to the regions in which the paste Ps is scraped up by the end portions of the squeegee 16b than the region in which the paste Ps is scraped up by the center portion of the squeegee 16b on the mask 14, as a result of which the distribution of the paste Ps at the time of supplying the paste Ps onto the mask 14 becomes even along the longitudinal direction of the squeegees 16b. For that reason, the rolling diameter of the paste Ps rolled on the mask 14 can be equalized along the longitudinal direction of the squeegee 16b, as a result of which the printing precision can be improved.

In the above-mentioned embodiment, the supply of the paste Ps is automated by controlling the discharge operation of the paste Ps by the paste supply syringe 16d by the control device 20. Alternatively, the supply of the paste Ps may be manually conducted by the operator OP.

The present invention is based on Japanese Patent Application No. 2012-105727 filed on May 7, 2012, and content thereof is incorporated herein by reference.

INDUSTRIAL APPLICABILITY

There are provided the screen printing machine and the screen printing method in which the rolling diameter of the paste rolled on the mask is equalized along the longitudinal direction of the squeegee, as a result of which the printing precision can be improved.

REFERENCE SIGNS LIST 1, screen printing machine
2, substrate
14, mask
14h, opening portion
16b, squeegee
16d, paste supply syringe (paste supply portion)
16A, squeegee unit shift mechanism (squeegee shift control portion, paste supply portion)
20, control device (squeegee shift control portion, paste supply portion)
Ps, paste

The invention claimed is:
1. A screen printing machine, comprising:
a mask that is brought into contact with a substrate;
a squeegee;
a squeegee shift control portion that performs a squeegeeing operation comprising: placing the squeegee to contact the mask; shifting the squeegee in a horizontal direction while abutting the squeegee against the mask brought into contact with the substrate to slide the squeegee on the mask, thereby scraping up the paste on the mask so that opening portions provided in the mask are filled with the paste to transfer the paste onto the substrate; and separating the squeegee from the mask;
a front clamp member and a rear clamp member that clamp and hold the substrate;

a paste supply portion; and a control device configured to determine whether there is a need to supply paste, when the control device determines there is a need to supply paste, the control device being configured to control the paste supply portion to supply a larger amount of the paste to regions in which the paste is scraped up by end portions of the squeegee than a region in which the paste is scraped up by a center portion of the squeegee on the mask such that distribution of the paste on the mask becomes even along a longitudinal direction of the squeegee and such that a rotating diameter of the paste rolled on the mask becomes even along the longitudinal direction of the squeegee when the squeegeeing operation is performed, after at least one squeegeeing operation is performed and at least before the paste is transferred onto the substrate by the squeegee in a next squeegeeing operation, wherein after the at least one squeegeeing operation, the control device is configured to move the squeegee up to separate from the mask and move the paste supply portion above one of the front clamp member or the rear clamp member to supply paste and the control device is configured to move the squeegee to outside of the supplied paste from the opening portions.

2. The screen printing machine of claim 1, wherein the screen printing machine comprises a front squeegee and a rear squeegee;

the screen printing machine comprises a base portion to which the front and rear squeegees and the paste supply portion are attached, wherein when the base portion is at the opening portions of the mask, the paste supply portion is closer to the rear clamp member than the rear squeegee is and the front squeegee is closer to the front clamp member than the rear squeegee is;

after one squeegeeing operation in which the base portion moves in a direction from the front clamp member to the rear clamp member, the control device is configured to move the base portion in a direction from the rear clamp member to the front clamp member so that the paste supply portion is positioned above the rear clamp member to supply paste, move the base portion in the direction from the front clamp member to the rear clamp member to contact the rear squeegee with the paste supplied above the rear claim member, and start next squeegeeing operation in which the base portion moves in the direction from the rear clamp member to the front clamp member.

3. A screen printing method, comprising:

clamping and holding a substrate with a front clamp member and a rear clamp member;

bringing a mask into contact with the substrate;

performing a squeegeeing operation comprising: placing a squeegee to contact the mask; shifting the squeegee in a horizontal direction while abutting the squeegee against the mask brought into contact with the substrate to slide the squeegee on the mask, thereby scraping up the paste on the mask so that opening portions provided in the mask are filled with the paste to transfer the paste onto the substrate; and separating the squeegee from the mask;

determining whether there is a need to supply paste;

when it is determined that there is a need to supply the paste, supplying a larger amount of the paste to regions in which the paste is scraped up by the end portions of the squeegee than a region in which the paste is scraped up by a center portion of the squeegee on the mask such that distribution of the paste on the mask becomes even along a longitudinal direction of the squeegee and such that a rotating diameter of the paste rolled on the mask becomes even along the longitudinal direction of the squeegee when the squeegeeing operation is performed, after at least one squeegeeing operation is performed and at least before the paste is transferred onto the substrate by the squeegee in a next squeegeeing operation; and after the at least one squeegeeing operation, moving up the squeegee to separate from the mask, positioning a paste supply portion above one of the front clamp member or the rear clamp member, and moving the squeegee outside of the supplied paste from the opening portions.

4. The screen printing method of claim 3, further comprising:

providing a base portion that holds a front squeegee and a rear squeegee, and the paste supply portion, wherein when the base portion is at the opening portions of the mask, the paste supply portion is closer to the rear clamp member than the rear squeegee is and the front squeegee is closer to the front clamp member than the rear squeegee is;

after one squeegeeing operation in which the base portion moves in a direction from the front clamp member to the rear clamp member, moving the base portion in a direction from the rear clamp member to the front clamp member so that the paste supply portion is positioned above the rear clamp member to supply paste, moving the base portion in the direction from the front clamp member to the rear clamp member to contact the rear squeegee with the paste supplied above the rear claim member, and starting next squeegeeing operation in which the base portion moves in the direction from the rear clamp member to the front clamp member.

* * * * *